United States Patent [19]

Usifer et al.

[11] Patent Number: 5,104,770

[45] Date of Patent: Apr. 14, 1992

[54] POSITIVE-WORKING PHOTORESIST COMPOSITIONS

[75] Inventors: Douglas A. Usifer, Providence; Michael G. Kelly, Coventry, both of R.I.

[73] Assignee: Hoechst Celanese Corporation, Somerville, N.J.

[21] Appl. No.: 167,068

[22] Filed: Mar. 11, 1988

[51] Int. Cl.⁵ .......................... G03C 1/73; G03F 7/039
[52] U.S. Cl. ...................................... 430/270; 430/326
[58] Field of Search ............... 430/326, 913, 914, 270; 522/65, 166

[56] References Cited

U.S. PATENT DOCUMENTS

| | | | |
|---|---|---|---|
| 3,558,311 | 1/1971 | Delzenne | 430/270 |
| 4,255,513 | 3/1981 | Laridon et al. | 430/288 |
| 4,282,309 | 8/1981 | Laridon et al. | 430/288 |
| 4,618,564 | 10/1986 | Demmer et al. | 430/270 |
| 4,956,264 | 9/1990 | Geissler et al. | 430/281 |

OTHER PUBLICATIONS

Wilson et al., "Introduction to Microlithography: Theory, Materials, Processes", ACS, 1983, pp. 92, 114.
Delzenne et al. *Eur. Polymer J.*, 1970, 6, 933.
Tsunooka et al., *J. Polymer Sci., Polymer Chem. Ed.*, 1977, 15, 107.
Ohta and Tokamaru, *Bull. Chem. Soc. Japan*, 1975, 48, 2393.
Okada, T., Kawanisi, M. and Nozaki H., "Photolysis of Aromatic Oxime Benzoates", *Bull. Chem. Soc. Japan*, vol. 42, p. 2981, Oct., 1969.
Hasebe, M., Kogawa, K. and Tsuchiya, T., "Photochemical Arylation by Oxime Esters in Benzene and Pyridine: Simple Synthesis of Biaryl Compounds", *Tetrahedron Letters*, vol. 25, No. 35, pp. 3887–3890, 1984.

*Primary Examiner*—Marion E. McCamish
*Attorney, Agent, or Firm*—Hugh C. Crall

[57] ABSTRACT

A photolithographic resist with sensitivity for actinic radiation in the short wavelength, ultraviolet region is produced from (1) an organic film-forming material, and (2) an oxime carboxylate ester which releases a carboxylic acid on exposure to deep ultraviolet radiation, thereby rendering the composition more soluble in a developer in the exposed regions than in the unexposed regions. A process for the formation of an image is also disclosed comprising (1) exposing the above composition to actinic radiation in a pre-determined pattern and (2) treating the composition with aqueous base developer to remove the exposed areas. The image-forming process may be used in the production of printing plates and microelectronic circuits.

12 Claims, No Drawings

POSITIVE-WORKING PHOTORESIST COMPOSITIONS

BACKGROUND OF THE INVENTION

This invention relates to new radiation-sensitive positive photoresist compositions. In the production of an image using a positive photoresist, the portions of the resist that are exposed to actinic radiation become more soluble in or more easily removed by a developer compared to the unexposed regions. Removal of the exposed regions by means of a developer, leaving the unexposed areas intact, results in the production of a positive image.

Generally commercially available positive photoresist compositions contain, in addition to an organic film-forming material which is usually a phenol-formaldehyde (novolac) resin, an O-naphthoquinone diazide compound which decomposes on exposure to actinic radiation to produce an indene carboxylic acid with the evolution of nitrogen. Before exposure, the O-naphthoquinone diazide acts as a dissolution inhibitor for the organic film forming material. Upon exposure, however, the diazide is decomposed and completely loses its ability to act as an inhibitor and, in fact, becomes a dissolution enhancer. Thus, the dissolution rate of the exposed area becomes greater compared to that of the non-exposed areas. However, there are several problems associated with the use of O-naphthoquinone diazides, foremost among these is their thermal instability. The diazides decompose at moderately elevated temperatures, even with protection from actinic radiation. This potential to decompose at moderately elevated temperatures renders the production of a quality image at high processing temperatures impossible. In addition, relatively large quantities of these diazides are required to make them useful as dissolution inhibitors. Also, because they absorb very strongly in the deep ultraviolet region, photoresist compositions employing these diazides are relatively opaque to deep ultraviolet radiation and thus cannot be developed fully. This problem results because the radiation cannot penetrate deeply into the photoresist coating.

Attempts to correct the problems associated with the diazonaphthoquinone inhibitors led to the production of 5-diazo Meldrum's acid and derivatives, as disclosed in U.S. Pat. No. 4,339,522. Although these materials, specifically designed for the deep ultraviolet region, were much more sensitive to the deep UV compared to the classical diazonaphthoquinone, these Meldrum's acid diazo compounds were not usable at high processing temperatures due to the fact that these compounds were evolved (sublimed) from the matrix resin to a significant extent at a relatively low temperature. Attempts to modify the structure of Meldrum'sdiazo led to several other problems, including insolubility in common casting solvents, as well as the sublimation problem described above. This information is reported in *IEEE Trans. Electron Dev.*, Vol. ED-28(11), 1300 (1981).

European Patent Application No. 241,423 to Demmer discloses positive working photoresist compositions using light sensitive oxime sulfonate compounds. Sulfonate oximes generally have a lower heat stability and are capable of crosslinking polymers at elevated temperatures.

A photoresist composition comprised of o-nitrobenzyl cholate inhibitor in poly(methylmethacrylate-co-methacrylic acid) (P(MMA-MAA) resin, disclosed in U.S. Pat. No. 4,666,820 issued May 19, 1987, (see also U.S. Pat. No. 4,400,461) was reported to be photoimageable employing deep ultraviolet radiation. Specifically, this composition was reported to yield surprisingly high contrasts. However, the mechanism reported for this photoreaction is not a completely conventional one; i.e. the mechanism involves inhibitor-assisted breakdown of the base-soluble P(MMA-MAA) resin in the exposed areas relative to the unexposed areas. The conventional mechanism, i.e. breakdown of the base-insoluble inhibitor into base-soluble fragment(s), leaving the resin binder entirely in tact, to produce a dissolution rate enhancement, is operating only to a very small extent. This information can be found in the *Journal of Polymer Science: Polymer Chem. Ed.*, 21, 1975 (1983). The propensity for poly(methylmethacrylate) (PMMA) resin to degrade in the presence of deep ultraviolet radiation or free radicals is well known in the art. Other conventional base-soluble resins (e.g. novolac or poly(-hydroxystryene)) do not display this type of behavior. It would therefore be highly unlikely that a photoresist comprised of o-nitrobenzyl cholate inhibitor in novolac or poly(hydroxystyrene) resin could demonstrate the surprisingly high contrasts observed with P(MMA-MAA).

PMMA, compared to novolac or poly(hydroxystyrene), is also an undesirable resin for use in photoresists due to its extremely low plasma etch resistance.

In addition, the o-nitrobenzyl cholate/P(MMA-MAA) resist has been reported to possess poor dark field erosion resistance and relatively low sensitivity to 248 nm narrow band radiation. No high resolution patterns (e.g. <1.0 micron) were obtainable under these conditions. This information is available in *J. Vac. Sci. Technol. B.*, 5, 396 (1987).

It had not been previously known that oxime carboxylate esters, when present with a base-soluble organic film-forming material, could suppress the dissolution rate of this film-forming material and that, after exposure to deep ultraviolet radiation, the oxime carboxylate ester would lose its ability to become a dissolution rate inhibitor and become a dissolution rate enhancer.

It is the object of this invention to provide new, positive-working photoresist compositions which possess high sensitivity to the deep ultraviolet region, producing quality, aqueous base developable images after exposure in a pre-determined pattern. In addition, the dissolution inhibitor of this invention is highly stable toward thermal degradation. This advantage allows for the production of high quality images at relatively high processing temperatures. Still another advantage of the present invention over the coventional O-naphthoquinone diazide-type systems is that the oxime carboxylate ester inhibitor compounds have little or no absorption of light in the conventional UV range (above 300 nm) and hence require no optical filters to obtain the higher resolution images available employing only shorter wavelength (deep UV) radiation.

SUMMARY OF THE INVENTION

New radiation-sensitive positive photoresist compositions comprising a compound containing an oxime carboxylate ester which liberates a carboxylic acid upon exposure to deep ultraviolet radiation and an organic polymeric binder whose base solubility is increased in the presence of a carboxylic acid.

The oxime carboxylate esters of the invention have the general formulae:

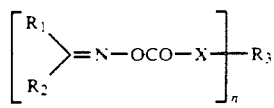

AND

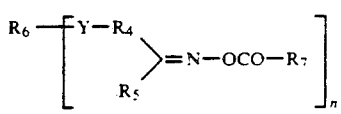

wherein the moieties $R_1$, $R_2$, $R_5$ and $R_7$ are independently selected from hydrogen, monovalent aliphatic or aromatic groups and the moieties X and Y are selected from divalent aliphatic groups, oxy or thio or a direct covalent bond. $R_4$ represents a divalent alkylene of 1 to 6 carbons, or divalent arylene of 6 to 10 ring carbons and $R_6$ and $R_3$ are monovalent or divalent moieties depending upon the value of the integer n which may be 1 or 2 and selected from hydrogen, aliphatic groups of 1 to 18 carbon and aromatic groups of 6 to 10 ring carbons. The invention is also a liquid coating composition of the novel photoresist of the invention and to methods for their use.

DESCRIPTION OF THE PREFERRED EMBODIMENTS

The present invention relates to radiation-sensitive photoresist compositions comprising:
(A) a film-forming organic material and
(B) an oxime carboxylate ester which liberates a carboxylic acid on exposure to deep ultraviolet radiation, the composition being substantially free from ethylenically unsaturated material which is polymerizable by means of free radicals.

A further aspect of this invention is a process for the production of an image comprising:
(i) exposing to deep ultraviolet radiation in a pre-determined pattern, a composition supported on a substrate, which composition comprises
(A) a film-forming organic material and
(B) an oxime carboxylate ester which liberates a carboxylic acid on exposure to deep ultraviolet radiation, thereby rendering the composition more soluble in an aqueous base developer in exposed areas than in unexposed areas.

The oxime carboxylate esters which liberate a carboxylic acid on exposure to deep UV radiation are typically of the formula:

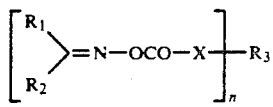

AND

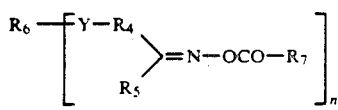

where n is 1 or 2, preferably 1, $R_1$ and $R_2$ are independently selected from hydrogen, or $C_1$-$C_8$-alkyl which is unsubstituted or substituted by —OH, —Cl, $C_1$-$C_4$-alkoxy, —CN, $C_2$-$C_5$-alkoxycarbonyl, phenyl, chlorophenyl, $C_7$-$C_{10}$-alkylphenyl or $C_7C_{10}$-alkoxyphenyl, benzoyl; or phenyl which is unsubstituted or substituted by —Cl, $C_1$-$C_4$-alkyl, $C_1$-$C_4$-alkoxy, in addition $R_2$ is $C_2$-$C_8C$ -alkoxycarbonyl, —CN, —$NH_2$, or —$CONH_2$; or $R_1$ and $R_2$ together with the carbon atom to which they are bound form a $C_4$-$C_{10}$-cycloalkyl ring which may contain a carbonyl function alpha to the imino carbon; the most preferred composition is when $R_1$ and $R_2$ are both phenyl;

X and Y are independently selected from a direct bond, or it is —$CH_2$— or $C_2$-$C_5$-alkylene unsubstituted or substituted with —Cl, —Br, —CN, —$NO_2$, preferably a direct bond;

$R_3$ is, when n=1, $C_1$-$C_{18}$-alkyl, phenyl which may be unsubstituted or substituted by halogen, $C_1$-$C_{12}C$ -alkyl, $C_1$-$C_4$-alkoxy, most preferably methoxy, or $C_1$-$C_4$-alkyl-CONH—, phenyl—CONH—, —$NO_2$ or benzoyl; or it is naphthyl which is unsubstituted or substituted by halogen, $C_1C_{12}$-alkyl or $C_1$-$C_4$-alkoxy; or it is $C_5C_6$-cycloalkyl, $C_7C_9$-aralkyl, —$CF_3$, —$CCl_3$, —F, or $NH_2$, or $R_3$ and $R_2$ or $R_3$ and $R_1$ together with the atoms to which they are bonded, form a $C_5$-$C_{12}$-heterocyclic ring, and $R_3$ is, when n=2, a $(CH_2)_m$ group, wherein m is 2 to 8, or phenylene or naphthylene each unsubstituted or substituted by $C_1$-$C_{15}$-alkyl, —Cl, —Br, —CN, $NO_2$, or —$OCH_3$; preferably $R_3$ is phenyl.

$R_4$ represents arylene, preferably phenylene, or it is a substituted arylene, methylene, $C_2$-$C_6$ straight, branched, or cyclic alkylene, optionally substituted by phenyl, naphthyl, or $C_1$-$C_4$-alkyl; and $R_5$ is preferably phenyl, or it represents a hydrogen atom; $C_1$-$C_8$-alkyl, optionally substituted by —OH, —Cl, $C_1$-$C_4$-alkoxy, CN, $C_2$-$C_5$-alkoxycarbonyl, phenyl, chlorophenyl, $C_7$-$C_{10}$alkylphenyl; or it is $C_7$-$C_{10}$-alkoxyphenyl which may be optionally substituted by —Cl, $C_1$-$C_4$ alkyl, or $C_1$-$C_4$-alkoxy; $C_2$-$C_8$-alkoxycarbonyl; or CN, or —$NH_2$, or benzoyl, or alkoxyl, and $R_6$ is, when n=1, preferably a hydrogen atom, or it is $C_1$-$C_8$-alkyl, or phenyl, substituted phenyl, or halogen; or $R_5$ and $R_6$ together with the atoms to which they are bound can form a $C_6$-$C_{12}$-carbocyclic or heterocyclic ring. $R_6$ is, when n=2, a divalent aliphatic group of 1 to 18 carbons or a divalent aromatic group of 6 to 10 carbons.

$R_7$ is preferably phenyl unsubstituted or substituted by alkoxy, most preferably methoxy, or halogen, or $NO_2$, or it represents $C_1$-$C_{18}$ straight or branched alkyl which may be optionally substituted by halogen or $C_1$-$C_4$-alkoxy; or it is $C_6$-$C_{12}$-aryl; optionally substituted by $C_1$-$C_{15}$-alkyl, or $NO_2$; $C_5$-$C_6$-cycloalkyl, or $R_7$ and $R_5$, together with the atoms to which they are bound, form a $C_6$-$C_{12}$-heterocyclic ring.

Compounds of the above type are described in U.S. Pat. No. 4,590,145 as photopolymerization initiators for ethylenically unsaturated monomers.

The oxime carboxylate esters of the invention can be easily prepared in good yield by reaction of a compound bearing oxime functionality with a compound bearing carbonyl chloride functionality in the presence of a suitable base, such as pyridine, or triethylamine, or N-methylmorpholine, in a suitable organic solvent, such as N-methylpyrrolidinone, N,N-dimethylacetamide, N,N-dimethylformamide, methylene chloride, tetrahydrofuran, propylene glycol methyl ether acetate. Preferably, the reaction is carried out in a solvent that can also act as a base, such as pyridine. The product can be precipitated from the reaction mixture by the addition of the reaction mixture to a solvent, which is being stirred, that is miscible with the reaction solvent, yet immiscible with the desired product. Such a procedure can be exemplified by the addition of an N-methylpyrrolidinone solvent reaction mixture into water that is being agitated or stirred. Alternatively, the product could be isolated by washing an organic reaction mixture with water to remove water miscible salts and then evaporating the organic solvent to dryness to recover the desired product. The oxime carboxylate esters obtained from this procedure are usually recrystallized from a suitable solvent; however, the product obtained from the reaction mixture before recrystallization is usually sufficiently pure for use in the present invention. The starting oxime containing compound, if not available from commercial chemical suppliers, can be easily prepared by conventional synthetic procedures. Examples of these types of preparations may be found in "The Systematic Identification of Organic Compounds," John Wiley and Sons, New York, 1980, p. 181, or *Die Makromoleculare Chemie*, 1967, 108, 170, or *Organic Synthesis*, 1979, 59, 95.

The organic film-forming material which is soluble in aqueous base is preferably one containing phenolic hydroxyl groups or a phosphonic, phosphoric, carboxylic, or sulfonic acid groups.

Such film forming materials include novolac resins which are prepared from an aldehyde such as acetaldehyde or furaldehyde, preferably formaldehyde, with a phenol such as phenol itself, phenol substituted by 1 or 2 chlorine atoms, such as p-chlorophenol, or 1 or 2 alkyl groups of 1 to 9 carbon atoms each, e.g., o-, m-, p-cresol, the xylenols, p-tert.butyl phenol, and p-nonylphenol, p-phenylphenol, resorcinol, bis(4-hydroxyphenyl)methane, and 2,2-bis(4-hydroxyphenyl)methane.

Other suitable film forming materials include homopolymers and copolymers of ethylenically unsaturated carboxylic acids and carboxylic acid anhydrides. These materials include copolymers of acrylic and methacrylic acids with, for example, vinyl aromatic compounds such as styrene, or substituted styrenes, including preferably homopolymers and copolymers of hydroxystyrene and phenyl ring-substituted hydroxystrene.

Additional film forming materials are carboxyl-terminated polyesters such as those obtainable by reaction of a dihydric alcohol with a dicarboxylic acid. Dihydric alcohols which may be employed include ethylene glycol, diethylene glycol, and higher polyoxyethylene glycols; propane-1,2-diol, dipropylene glycol, and higher polyoxypropylene glycols; propane-1,3-diol; butane-1,4-diol and polyoxytetramethylene glycols; pentane-1,5-diol, resorcitol, bis(4-hydroxycyclohexyl)methane, and 2,2-bis(4-hydroxycyclohexyl)propane. Dicarboxylic acids which may be employed include aliphatic acids such as succinic, glutaric, adipic, pimelic, suberic, azelaic, or sebacic acids, dimerized linoleic acid, aromatic acids such as phthalic, isophthalic, and terephthalic acids, and cycloaliphatic acids such as hexahydrophthalic acid.

Also suitable film forming materials are acid group-containing adducts of polyepoxides having on average, more than one 1,2 epoxide groups per molecule, with polycarboxylic acids, especially dicarboxylic acids, or withssubstances which contain a carboxylic, sulphonic, phosphonic or phosphoric acid group and also a group which reacts preferentially, under the conditions used for adduct formation, with the epoxide groups of the polyepoxide. Such a group is conveniently a primary or secondary aliphatic or aromatic amino group, or a mercapto group.

The process of this invention is carried out by first coating a layer of the photosensitive composition of the invention onto a substrate from a solvent, such as N-methylpyrrolidinone, methyl ethyl ketone, cyclopentanone, propylene glycol mono methyl ether acetate, 2-ethoxy ethyl acetate, N,N-dimethylformamide, or mixtures thereof, in a conventional manner, such as by dip, roll, spray coating, or preferably spin coating. The residual solvent is evaporated either by air-drying or heating, optionally under reduced pressure. The substrate may be copper, aluminum, or other metal, synthetic resin or plastic, such as a film of a polyester, a polyamide, polyimide, a polyolefin, or silicon oxide, or silicon nitride. The composition is applied such that the resist layer, after drying, is between about 0.3 and 200 microns thick, preferably between 0.5 and 2.0 microns thick.

The exposure of the composition to actinic radiation in a predetermined pattern may be achieved by exposure through a suitable image-bearing mask consisting of opaque and transparent areas. Deep ultraviolet radiation is employed in the range of 180 nm–300 nm, preferably 220–280 nm, and suitable sources include deuterium arcs, mercury vapor arcs, xenon-mercury arcs, pulsed mercury arcs, xenon arcs, and various laser sources, such as the krypton-fluoride excimer laser. The exposure time required depends on several factors such as the nature of the composition employed, the thickness of the layer, the type of radiation source, and the distance of the radiation source from the layer. The exposure time is generally on the order of 10 seconds to 4 minutes, but can be readily determined by routine experimentation.

After the resist layer is image-wise exposed, it is washed with an aqueous base developer to remove the exposed areas, leaving the unexposed areas. The developer thus dissolves or renders much more easily removed the exposed areas, and gentle agitation may be employed if necessary.

The aqueous base developer can be an aqueous solution of a strong base such as N-methylmorpholine; however, an aqueous alkaline solution, such as one containing sodium hydroxide, sodium carbonate, sodium bicarbonate, tetramethylammonium hydroxide, or the like, is preferred. A very small amount, generally 5–15% by volume, of a water-soluble lower alcohol may be added to the developer solution to speed development, if necessary.

After the exposure and development steps, the substrate may be etched. There are several reasons why etching may be employed, including the desire to remove metal from the exposed areas in the formation of a printed circuit, or the desire to increase the depth of image. Suitable etching procedures are well known in the art.

EXAMPLE I

Preparation of O-Anisoylbenzophenone Oxime

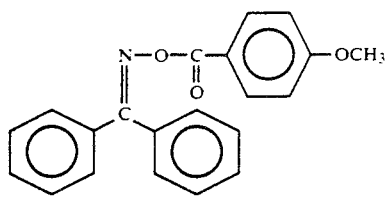

IA) Benzophenone Oxime

A 500 ml flask was fitted with a reflux condenser and charged with hydroxylamine hydrochloride (8.40 g, 0.12 mole), ethanol (200 ml), pyridine (9.71 ml, 0.12 mole) and benzophenone (20.0 g, 0.11 mole). After heating at reflux with stirring for 2 hours; ethanol (100 ml) was removed by distillation and the flask allowed to stand at room temperature for 4 hours. During this time, crystals formed and they were removed by vacuum filtration. The reaction product was recovered in amount of 20.0 g (92%), mpt. 134°–136° C.; IR absorption (KBr) $vC=N$ 1500 cm$^{-1}$ (m), $vN$—OH 3240 cm$^{-1}$ (m).

IB) 0-Anisoylbenzophenone Oxime

A 500 ml, three-neck flask was fitted with a septum, a nitrogen gas inlet and a ground glass stopper. The apparatus was purged with nitrogen and charged with pyridine (400 ml) and benzophenone oxime (15 g, 0.075 mole). After the solution was homogeneous, p-anisoyl chloride (14.5 g, 0.085 mole) was injected slowly, dropwise into solution. After stirring at room temperature overnight, the solution was added slowly to cold water under agitation to precipitate a white solid. Crystallization from ethanol afforded colorless plates: 21.2 g (84%); mpt. 152°–153° C.; IR (KBr) $vC=0$ 1740cm$^{-1}$ (s); M+ 332 (1.40%), m/e 180 [M-OCOC$_6$H$_4$OCH$_3$(100%)λmax (εm) 272 nm (27,400), 195 nm (60,970).

EXAMPLE II

Preparation of O-Benzoylacetophenone Oxime

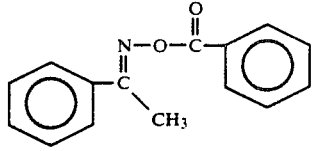

IIA) Acetophenone oxime was prepared from acetophenone as described in Example IA. mpt. 48°–49° C.; IR (KBr) $vC=N$ 1510 cm$^{-1}$ (m).

IIB) O-Benzoylacetophenone oxime was prepared from pyridine (75 ml), acetophenone oxime (12.0 g, 0.089 mole), and benzoyl chloride (11.4 ml, 0.098 mole) as in Example IB. Crystallization from ethanol afforded colorless needles: 17.2 (81%); mpt. 95°–96° C., IR (KBr) $vC=0$ 1750 cm$^{-1}$ (s); M+ 239 (3.5%), m/e [M-OCOPh] (30%), m/e 105 [100%]; λmax (εm) 248 (20,900), 195 (44,350).

EXAMPLE III

Preparation of Di(O-Lauroyl)diphenylglyoxime

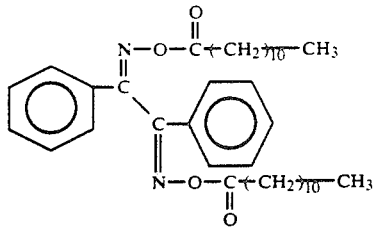

IIIA) Di(O-Lauroyl)diphenylglyoxime was prepared from pyridine (75 ml), diphenyl glyoxime (10.0 g, 0.042 mole), and lauroyl chloride (20.4 ml, 0.088 mole) as in Example IB. Crystallization from ethanol gave fluffy, colorless needles: 24.1 g (95%) mpt. 77°–78° C.; IR (KBr) vCH 2860 cm$^{-1}$ and 2880 cm$^{-1}$(m); $vC=0$ 1780 cm$^{-1}$ (s); M+ 605 (10.5%); λmax (εm) 224 nm (16,300).

EXAMPLE IV

Preparation of O-Benzoylcyclohexanone Oxime

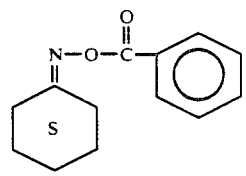

IVA) O-Benzoylcyclohexanone oxime was prepared from pyridine (75 ml), cyclohexanone oxime (ALDRICH, 15 g, 0.13 mole), and benzoyl chloride (15.4 ml, 0.13 mole) as in Example IB. Crystallization from ethanol/water gave colorless plates: 21.7 g (77%); mpt. 60°–61° C.; IR (KBr) vCH 2860 cm$^{-1}$ and 2880 cm$^{-1}$ (m), $vC=0$ 1740 cm$^{-1}$ (s); M+ 217 (1.8%), m/e 105 [M-(CH$_2$)$_5$C=NO] (100%); λmax (εm) 230 (14,100).

EXAMPLE V

O-Benzoylbenzamidoxime

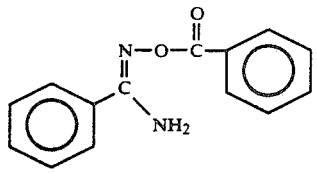

VA) Benzamidoxime

An one liter round-bottom flask was fitted with a reflux condenser and charged with hydroxylamine hydrochloride (36.7 g, 0.52 mole) water (50 ml), sodium hydroxide (20.8 g, 0.52 mole) in water (50 ml) and ethanol (75 g). The solution was cooled to 0° C. with an ice-water bath. Benzonitrile (50.0 g, 0.48 mole) in ethanol (60 g) were added to solution, and the reaction was heated to reflux for 14 hours. After removing the ethanol by evaporation, the aqueous mixture was extracted with ether (250 ml) and the organics were dried (Na$_2$SO$_4$). Removal of the ether left an orange, oily solid which crystallized from toluene as colorless needles: 49.5 g (76%); mpt. 75°–77° C.; IR (KBr) vNH 3440 cm$^{-1}$ and 3380 cm$^{-1}$; $vC=N$ 1645 cm$^{-1}$ (s);

VB) O-Benzoylbenzamidoxime

A 500 ml, three-neck flask was fitted with a septum, a nitrogen gas inlet and a ground glass stopper. The apparatus was purged with nitrogen and charged with benzamidoxime (15 g, 0.11 mole), benzene (200 ml), and triethylamine (16.9 ml, 0.12 mole). The mixture was cooled to 10° C. and benzoyl chloride (13.9 ml, 0.12 mole) was injected slowly into solution. After stirring at 10° C. for 2 hours, the precipitate was filtered off and washed copiously with ice-water and air-dried. Crystallization from ethanol gave colorless needles: 20.5 g (77%); mpt. 148° C.; IR (KBr) $vC=O$ 1730 cm$^{-1}$; M+ 240 (32%), m/e 105 [M-C$_6$H$_5$CH$_2$NH$_2$] (100%) $\lambda$max ($\epsilon$m) 260 ($\epsilon$m) (6,800), 224 nm (10,900); 195 nm (37,100).

EXAMPLE VI

Preparation of O-Anisoyl-α-hydroxyiminobenzyl cyanide

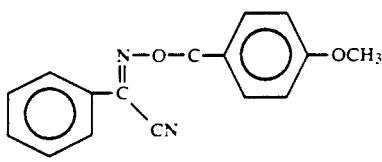

VIA) α-Hydroxyiminobenzyl cyanide was prepared in 56% yield according to the procedure detailed in *Org. Syn.*, 1979, 59, 95 mpt: 119°-121° C. IR (KBr) $vN-OH$ 3380 cm$^{-1}$ (s); $vC=N$ 2220 cm$^{-1}$ (w).

VIB) O-Anisoyl)-α-hydroxyiminobenzyl cyanide was prepared from α-hydroxyiminobenzyl cyanide (12.0 g, 0.083 mole), pyridine (100 ml), and p-anisoyl chloride (14.1 g, 0.083 mole) as in Example IB. Crystallization from ethanol/water gave colorless plates, mpt. 155°-160° C.; 18.5 g (80%); IR (KBr) $vC=N$ 2220 cm$^{-1}$(w); $vC=O$ 1760 cm$^{-1}$ (s); M+ 281 (160%) m/e 135 [M-C$_6$H$_5$CNO(CN)] (100%); $\lambda$m) ($\epsilon$m) [THF] 250 nm (11,680), 295 nm (27,000).

EXAMPLE VII

Preparation of O-Lauroylbenzophenone Oxime

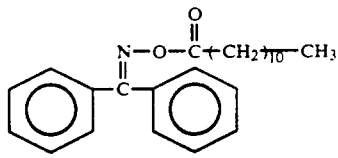

VIIA) O-Lauroylbenzophenone oxime was prepared with pyridine (75 ml), benzophenone oxime (15.0 g, 0.076 mole), and lauroyl chloride (17.6 ml, 0.076 mole) as in Example IB. Crystallization from ethanol gave colorless, long needles: 24.7 g (86%); mpt. 48°-49° C.; IR (KBr) vCH 2860 cm$^{-1}$ and 2820 cm (s), $vC=O$ 1780 cm (s); M+ 380 (1.8%), m/e 180 [M-OCO(CH$_2$)$_{10}$CH$_3$]100% $\lambda$max ($\epsilon$m) 250 nm (12,500), 200 nm (25,000).

EXAMPLE VIII

Lithographic Evaluation of O-Anisoylbenzophenone Oxime in Cresol-Formaldehyde Resin A formulation was prepared consisting of O-Anisoylbenzophenone oxime (3% by weight), cresol-formaldehyde resin (24% by weight), and propylene glycol monomethyl ether acetate solvent (73% by weight). The resist was spun onto a silicon wafer and baked at 90° C. for 30 minutes to give a 1.4 micron film. The film was exposed to the full spectrum of an OAI Deep UV source through a quartz optoline gradient mask. Development with buffered, aqueous potassium hydroxide solution gave clearly developed open areas and patterns.

EXAMPLE IX

Lithographic Evaluation of O-Benzoylbenzamidoxime In Cresol-Formaldehyde Resin

O-Benzoylbenzamidoxime was formulated at 3% by weight in cresol-formaldehyde resin (24% by weight) as in Example VIII. Irradiation of a similarly formed film through a 260 nm interference filter gave a clear, positive image.

EXAMPLE X

Lithographic Evaluation of O-Anisoylbenzophenone Oxime In Poly(4-hydroxystyrene) Resin O-Anisoylbenzophenone Oxime was formulated at 3% by weight in poly(4-hydroxystyrene) resin (24% by weight) as in Example VIII. Irradiation of a similarly formed film to the full spectrum of an HTG Deep UV source through a quartz mask gave, after development with buffered, aqueous potassium hydroxide solution, clearly developed open areas and patterns.

What is claimed is:

1. Radiation-sensitive photoresist compositions comprising:
   (A) an organic film-forming material consisting essentially of an aqueous base soluble material having a phenolic hydroxyl group or a carboxylic, sulfonic, phosphoric or phosphoric acid group; and
   (B) an oxime carboxylate ester which liberates a carboxylic acid on exposure to deep ultraviolet radiation, thereby effecting an enhancement of the dissolution rate of film-forming material in aqueous base;

wherein said composition is substantially free from ethylenically unsaturated material which is polymerizable by means of free radicals.

2. A composition according to claim 1 wherein said oxime carboxylate is selected from:
   O-Anisolybenzophenone
   O-Benzoylacetophenone
   Di(O-Lauroyl)diphenylgloxime;
   O-Benzolycyclohexanone oxime;
   O-Benzoylbenzamidoxime;
   O-Anisoyl-α-hydroxyiminobenzyl cyanide;
   O-Lauroyloxybenzophenone oxime;
   and mixtures thereof.

3. A process for forming an image which comprises:
   (a) applying a radiation-sensitive composition according to claim 2;
   (b) imagewise exposing said coated substrate to radiation; and
   (c) treating the exposed substrate with aqueous base developer to remove said composition in the exposed areas.

4. A process for forming an image which comprises
   (a) applying a radiation-sensitive composition according to claim 1 to a substrate;
   (b) imagewise exposing said coated substrate to radiation; and (c) treating the exposed substrate with aqueous base developer to remove said composition in the exposed areas.

5. A process for forming an image which comprises:
(a) applying a radiation-sensitive composition according to claim 1 wherein said oxime carboxylate ester is O-Anisoylbenzophebnone oxime;
(b) imagewise exposing said coated substrate to radiation; and
(c) treating the exposed substrate with aqueous base developer to remove said composition in the exposed areas.

6. A process for forming an image which comprises:
(a) applying a radiation-sensitive composition according to claim 1 wherein said oxime carboxylate ester is O-Benzoylacetophenone oxime;
(b) imagewise exposing said coated substrate to radiation; and
(c) treating the exposed substrate with aqueous base developer to remove said composition in the exposed areas.

7. A process for forming an image which comprises:
(a) applying a radiation-sensitive composition according to claim 1 wherein said oxime carboxylate ester is Di-(O-Lauroyl)diphenylgyoxime;
(b) imagewise exposing said coated substrate to radiation; and
(c) treating the exposed substrate with aqueous base developer to remove said composition in the exposed areas.

8. A process for forming an image which comprises:
(a) applying a radiation-sensitive composition according to claim 1 wherein said oxime carboxylate ester is O-Benzoylcyclohexanone oxime;
(b) imagewise exposing said coated substrate to radiation; and
(c) treating the exposed substrate with aqueous base developer to remove said composition in the exposed areas.

9. A process for forming an image which comprises:
(a) applying a radiation-sensitive composition according to claim 1 wherein said oxime carboxylate ester is O-Benzoylcyclohexanone oxime;
(b) imagewise exposing said coated substrate to radiation; and
(c) treating the exposed substrate with aqueous base developer to remove said composition in the exposed areas.

10. A process for forming an image which comprises:
(a) applying a radiation-sensitive composition according to claim 1 wherein said oxime carboxylate ester is O-Benzoylbenzamidozime;
(b) imagewise exposing said coated substrate to radiation; and
(c) treating the exposed substrate with aqueous base developer to remove said composition in the exposed areas.

11. A process for forming an image which comprises:
(a) applying a radiation-sensitive composition according to claim 1 wherein said oxime carboxylate ester is O-Anisoyl-α-hydroxyiminobenzyl cyanide;
(b) imagewise exposing said coated substrate to radiation; and
(c) treating the exposed substrate with aqueous base developer to remove said composition in the exposed areas.

12. A process for forming an image which comprises:
(a) applying a radiation-sensitive composition according to claim 1 wherein said oxime carboxylate ester is O-Lauroylbenzophenone oxime;
(b) imagewise exposing said coated substrate to radiation; and
(c) treating the exposed substrate with aqueous base developer to remove said composition in the exposed areas.

* * * * *